(12) United States Patent
Yan et al.

(10) Patent No.: US 9,852,903 B2
(45) Date of Patent: Dec. 26, 2017

(54) SYSTEM AND METHOD IN INDIUM-GALLIUM-ARSENIDE CHANNEL HEIGHT CONTROL FOR SUB 7NM FINFET

(71) Applicant: Applied Materials, Inc., Santa Clara, CA (US)

(72) Inventors: Chun Yan, San Jose, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/416,287

(22) Filed: Jan. 26, 2017

(65) Prior Publication Data

US 2017/0221706 A1 Aug. 3, 2017

Related U.S. Application Data

(60) Provisional application No. 62/288,120, filed on Jan. 28, 2016.

(51) Int. Cl.
*H01L 21/02* (2006.01)
*H01L 29/66* (2006.01)
*H01L 21/3105* (2006.01)

(52) U.S. Cl.
CPC .... *H01L 21/02546* (2013.01); *H01L 21/0234* (2013.01); *H01L 21/02664* (2013.01); *H01L 21/3105* (2013.01); *H01L 29/66795* (2013.01)

(58) Field of Classification Search
None
See application file for complete search history.

(56) References Cited

U.S. PATENT DOCUMENTS

2009/0286382 A1* 11/2009 Huff .................. C23F 4/00
438/455

* cited by examiner

*Primary Examiner* — Angel Roman
*Assistant Examiner* — Kevin Quinto
(74) *Attorney, Agent, or Firm* — Patterson + Sheridan LLP

(57) ABSTRACT

A method for forming a group III-V semiconductor channel region in a transistor is provided herein. The method includes exposing a substrate including an oxide layer to a first plasma to treat the oxide layer, exposing the treated oxide layer to a second plasma to convert the oxide layer to an evaporable layer, evaporating the evaporable layer to expose a group III-V semiconductor material surface, and exposing the group III-V semiconductor material surface to an oxygen containing gas to oxidize the group III-V semiconductor material. The processes may be repeated until a recessed depth having a predetermined depth is formed. A group III-V semiconductor channel is then formed in the predetermined recessed depth. The control of the height of the group III-V semiconductor channel is improved.

20 Claims, 5 Drawing Sheets

SYSTEM AND METHOD IN INDIUM-GALLIUM-ARSENIDE CHANNEL HEIGHT CONTROL FOR SUB 7NM FINFET

CROSS-REFERENCE TO RELATED APPLICATIONS

This application claims priority to U.S. Provisional Patent Application Ser. No. 62/288,120, filed on Jan. 28, 2016, which herein is incorporated by reference.

BACKGROUND

Field

Embodiments of the present disclosure generally relate to methods and apparatus for forming a semiconductor device. More specifically, embodiments described herein relate to a method for controlling channel height in a transistor.

Description of the Related Art

As circuit densities increase for next generation devices, the widths of interconnects, such as vias, trenches, contacts, gate structures and other features, as well as the dielectric materials therebetween, decrease to 7 nm or smaller dimensions, whereas the thickness of the dielectric layers remain substantially constant, with the result of increasing the aspect ratios of the features. Recently, complementary metal oxide semiconductor (CMOS) devices having fin field-effect transistors (FinFETs) or tunnel field-effect transistors (TFETs) have been widely used in many logic and other applications and are integrated into various different types of semiconductor devices.

Group III-V semiconductors, such as indium (In), gallium (Ga), and arsenic (As), may serve as a channel, or fin, material for sub-7 nanometer (nm) CMOS devices due to the low contact resistance, superior electron mobility and lower operation voltage. During the formation of the channel region, a portion of a group III-V semiconductor material may be removed to form a recessed depth. Conventional material removal processes, such as thermal, wet or dry etch, have certain drawbacks. High temperature thermal removal process is not suitable because of As diffusion and In/Ga segregation at high temperatures, as well as pits formation on the surface. Wet etch is not suitable because wet etch is typically performed ex-situ and is not good to control group III-V semiconductors recess depth with different feature sizes. High power RF plasma etch can damage the surface and causing residual oxygen implanting, as well as large etch depth loading.

Therefore, there is a need for an improved methods for forming group III-V semiconductor channels.

SUMMARY

In one embodiment, a method includes exposing an oxide layer formed on a substrate to a first plasma, exposing the oxide layer to a second plasma to convert the oxide layer to an evaporable layer at a first temperature, evaporating the evaporable layer at a second temperature higher than the first temperature to expose a surface of a group III-V semiconductor material, and exposing the surface of the group III-V semiconductor material to an oxygen containing gas.

In another embodiment, a method includes breaking oxygen bonds in an oxide layer, converting the oxide layer to an evaporable layer at a first temperature, evaporating the evaporable layer at a second temperature higher than the first temperature to expose a surface of a group III-V semiconductor material, and oxidizing the surface of the group III-V semiconductor material.

In another embodiment, a method includes a) exposing an oxide layer to a first plasma, b) exposing the oxide layer to a second plasma to convert the oxide layer to an evaporable layer at a first temperature, c) evaporating the evaporable layer at a second temperature higher than the first temperature to expose a surface of a group III-V semiconductor material, d) exposing the surface of the group III-V semiconductor material to an oxygen containing gas, e) iteratively repeating at least a-c, and f) forming a channel material on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method for forming a group III-V semiconductor channel region in a transistor is provided herein. The method includes exposing an oxide layer present on a substrate to a first plasma to treat the oxide layer, exposing the treated oxide layer to a second plasma to convert the oxide layer to an evaporable layer, evaporating the evaporable layer to expose a group III-V semiconductor material surface, and exposing the group III-V semiconductor material surface to an oxygen containing gas to oxidize the group III-V semiconductor material. The processes may be repeated until a recessed depth having a predetermined depth is formed. A group III-V semiconductor channel is then formed in the predetermined recessed depth. The control of the height of the group III-V semiconductor channel is improved. Additionally, the method also provides excellent selectivity and profile control.

Figure 1:
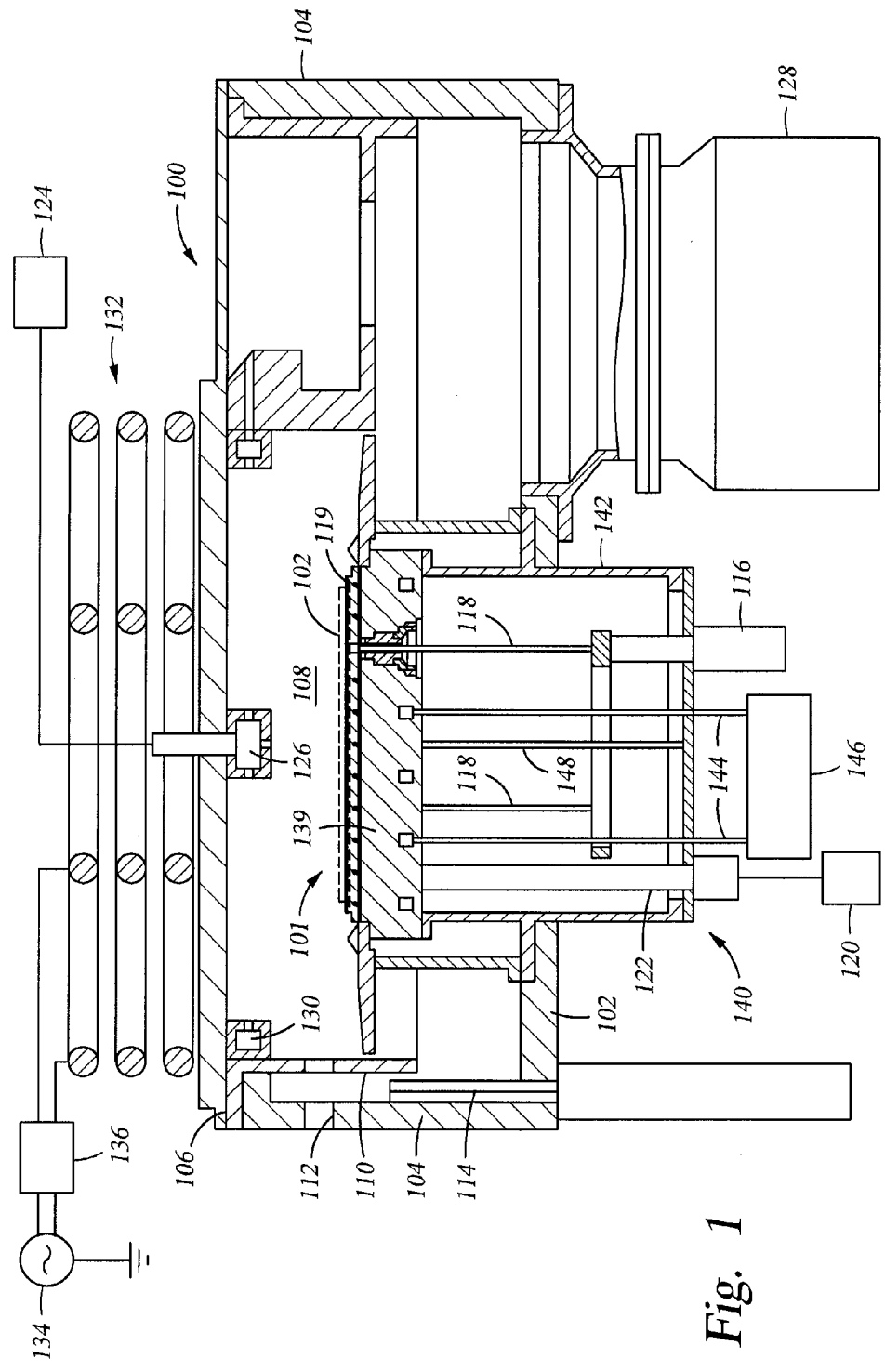
FIG. 1 illustrates a schematic, cross-sectional view of a plasma processing chamber within which embodiments of the disclosure may be performed.

FIG. 1 is a schematic, cross-sectional view of a plasma processing chamber 100 within which the method described herein may be performed. The substrate support assembly 101 may be used to support a variety of substrates, such as semiconductor substrates and reticles. The substrate support assembly 101 may include an electro-static chuck assembly.

The plasma processing chamber 100 includes a bottom 102, a sidewall 104 and a chamber lid 106 disposed over the sidewall 104 defining a processing volume 108. The plasma processing chamber 100 further includes a liner 110 disposed in the processing volume 108 to prevent the sidewall 104 from damage and contamination from the processing chemistry and/or processing by-products. A slit valve door opening 112 is formed through the sidewall 104 and the liner 110 to allow passage of the substrates and substrate transfer mechanism disposed in a system, such as a cluster tool (as described in FIG. 2) that is coupled to the plasma processing chamber 100. A slit valve door 114 selectively open and close the slit valve door opening 112.

The substrate support assembly 101, which includes substrate support 139 and a connection region 140, is disposed in the processing volume 108 and is supported by support(s) 142. A lift 116 is configured to raise and lower lift pins 118 relative to the substrate support assembly 101 during processing and loading/unloading the substrate 102. The connection region 140 of the substrate support assembly 101 is generally not in fluid communication with the processing volume 108. The connection region 140 includes a plurality of electrical connections (e.g., thermocouple wires, heater element wires, shielded e-chuck electrode wires, etc.) and tubes for transferring fluid through the substrate support assembly 101. In one embodiment, the connection region 140 includes the support(s) 142, cooling tubes 144 and electrical connections 122. In one configuration, the electrical connections 122 are used to couple the substrate support assembly 101 to a bias power source 120 for generating chucking force to secure the substrate 102 on the substrate support assembly 101. One or more heating elements 119, such as resistive heating elements, may be embedded in the substrate support 139 for heating and maintaining the substrate 102 to a predetermined temperature. The one or more heating elements 119 may be used to heat the substrate 102 to a temperature up to about 650 degrees Celsius. The connection region 140 may also include cooling tubes 144 for flowing a coolant (e.g., DI water) through the substrate support 139. The cooling tubes are connected to a heat exchanger 146. A temperature measuring device 148 may be coupled to the substrate support assembly 101.

One or more processing gases may be supplied to the processing volume 108 from a gas source 124 via an inlet 126. A vacuum pump 128 is in fluid communication with the processing volume 108. The vacuum pump 128 may be used to pump the processing volume 108 and maintain a low pressure environment through a plenum 130.

The plasma processing chamber 100 includes an antenna assembly 132 disposed outside the chamber lid 106. The antenna assembly 132 may be coupled to a radio-frequency (RF) plasma power source 134 through a matching network 136. During processing, the antenna assembly 132 is energized with RF power provided by the power source 134 to ignite the processing gases within the processing volume 108 to form a plasma and to maintain the plasma during processing of the substrate 102.

The plasma processing chamber 100 may be used for various plasma processes. In one embodiment, the plasma processing chamber 100 may be used to break oxygen bonds in an oxide layer, converting the oxide layer to an evaporable layer, evaporating the evaporable layer, and forming an oxide layer. The above mentioned processes can be performed in the plasma processing chamber 100, which leads to a reduced processing time.

Figure 2:
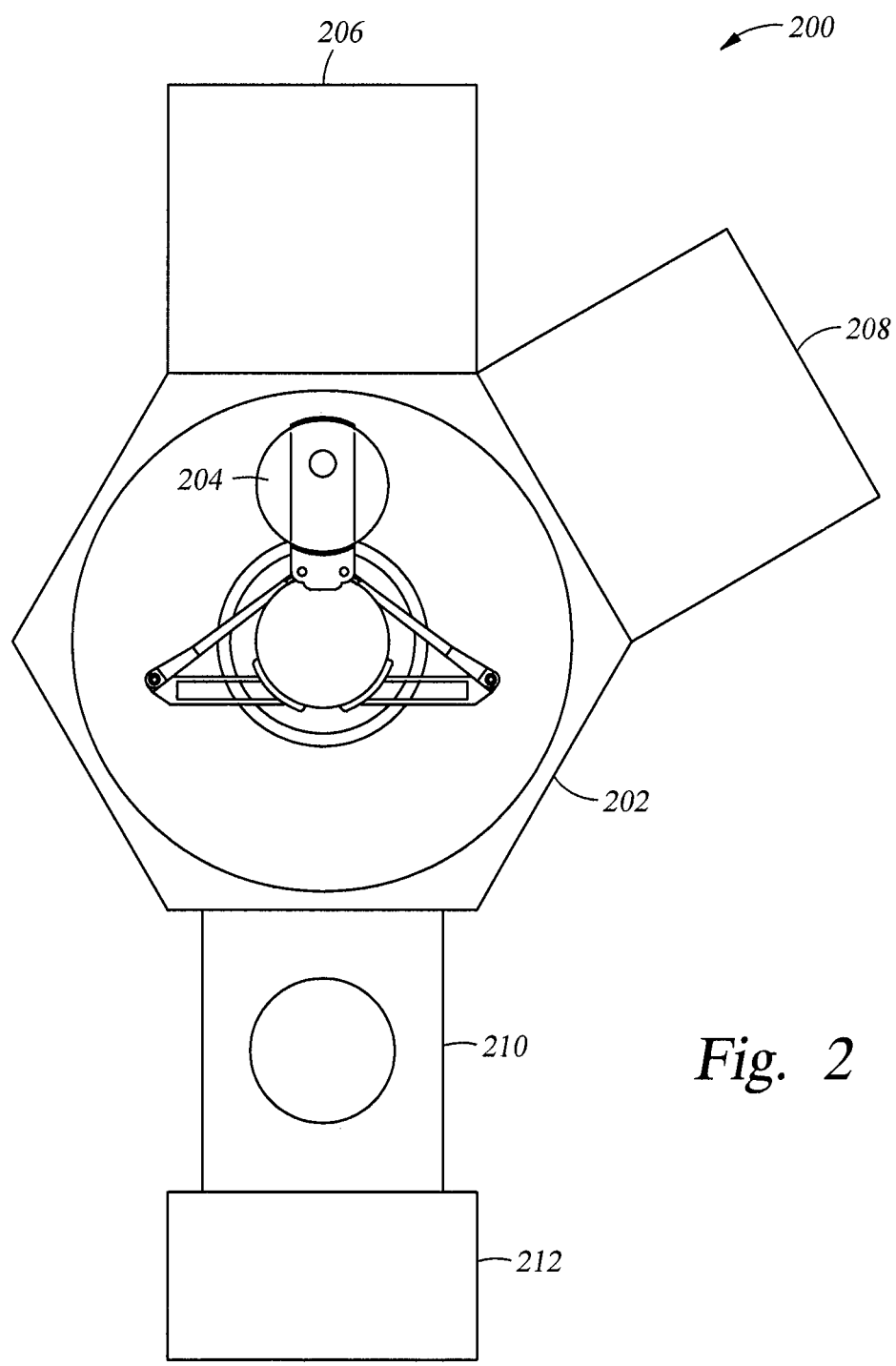
FIG. 2 illustrates a schematic top view of a cluster tool within which embodiments of the disclosure may be performed.

FIG. 2 illustrates a schematic top view of a cluster tool 200 within which embodiments of the disclosure may be performed. The cluster tool 200 may include a transfer chamber 202. Within the transfer chamber 202 is a substrate transferring mechanism 204. The substrate transferring mechanism 204 transfers a substrate, such as the substrate 102, from a first processing chamber 206 to a second processing chamber 208, or from the first processing chamber 206 or the second processing chamber 208 to a load lock chamber 210 and vice versa. The first processing chamber 206 and second processing chamber 208 are connected to the transfer chamber 202. The load lock chamber 210 is connected to a factory interface 212. In one embodiment, the first processing chamber 206 is the plasma processing chamber 100 and the second processing chamber 208 is a deposition chamber. The deposition chamber may be a commercially available process chamber, such as the Centura® RP Epi reactor, available from Applied Materials, Inc. of Santa Clara, Calif., or any suitable semiconductor process chamber adapted for performing epitaxial deposition processes. The first processing chamber 206, the second processing chamber 208, and the transfer chamber 202 may be maintained under vacuum. Thus, when transferring the substrate from one processing chamber to the other processing chamber, vacuum condition is not broken, reducing the chance of contamination.

Figure 3:
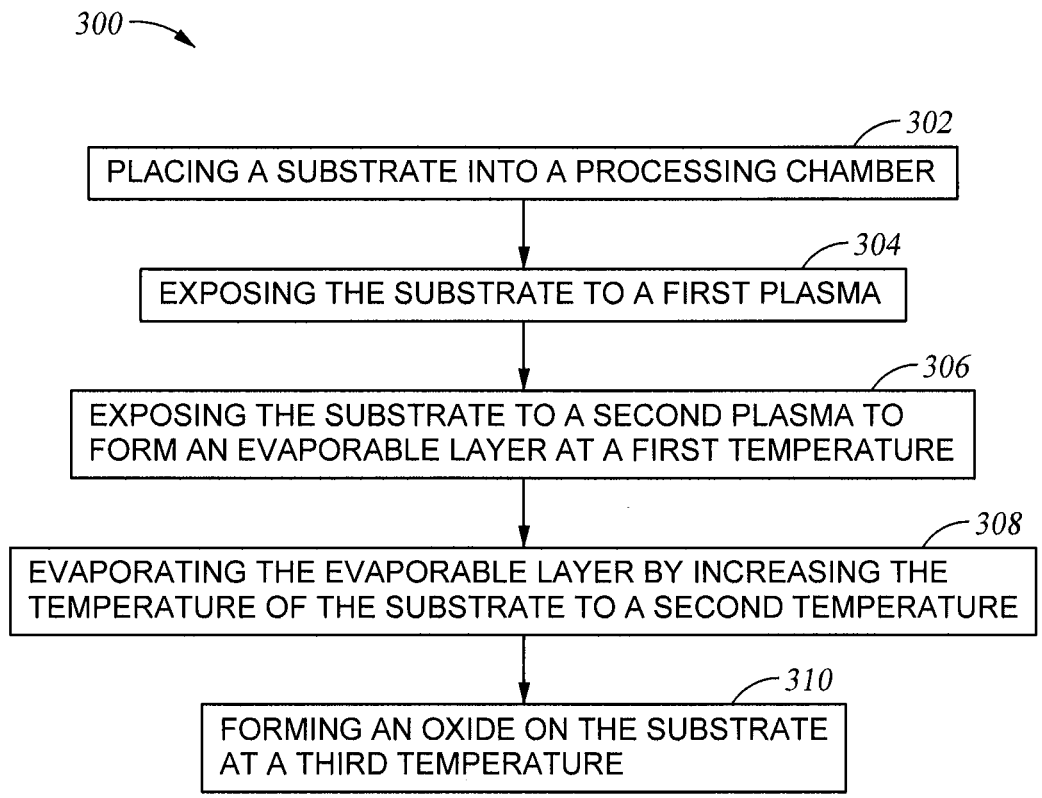
FIG. 3 illustrates operations of a method according to embodiments disclosed herein.

FIG. 3 illustrates operations of a method 300 according to embodiments disclosed herein. At operation 302, a substrate, such as the substrate 102, is placed into a plasma processing chamber, such as the plasma processing chamber 100. The substrate may include a native oxide layer formed on certain materials, such as one or more group III-V semiconductor materials, of the substrate due to prior atmospheric exposure. In one embodiment, the group III-V semiconductor material is GaAs. The substrate may be part of a device, such as a CMOS device with a critical dimension as low as 3 nm, for example 5 nm or 7 nm. At operation 304, the oxide layer disposed on the substrate may be exposed to a first plasma. The first plasma may be formed by flowing a first processing gas into the processing chamber and igniting the first processing gas to form the first plasma. The first processing gas may include a noble gas, such as argon (Ar), and a hydrogen source gas, such as hydrogen gas ($H_2$) or methane ($CH_4$). In one embodiment, the first processing gas includes Ar and $H_2$. The RF power used to igniting the first processing gas may be relatively low, such as between about 0.28 W/cm$^2$ and about 0.42 W/cm$^2$. The RF power may be pulsed. A relatively low bias power may be applied to first plasma. The bias power may be 0.028 W/cm$^2$ or below. The ion energy of the ions formed in the first plasma with the relatively low RF and bias powers may be relatively low, such as less than about 50 eV. The ions with relatively low ion energy break the oxygen bonds in the native oxide layer, such as In—O, Ga—O and As—O bonds, creating reactive sites. The temperature of the substrate during operation may be from about 20 degrees Celsius to less than about 400 degrees Celsius. One of the subsequent operations may include increasing the temperature of the substrate to up to about 650 degrees Celsius. In order to reduce the temperature ramping time, the temperature of the substrate may be maintained at near 400 degrees, such as about 300 degrees Celsius, during operation 304.

Next, at operation 306, the oxide layer disposed on the substrate is exposed to a second plasma. The substrate may be maintained at a temperature that is the same as or similar to that of during operation 304. The second plasma may be formed by flowing a second processing gas into the processing chamber and igniting the second processing gas to form the second plasma. The second processing gas may include a noble gas, a halogen gas, and a hydrogen source gas. In one embodiment, the second processing gas includes Ar, chlorine gas ($Cl_2$) and $H_2$. The ratio of volumetric flow rates of $Ar:Cl_2:H_2$ may be 10:1:3, respectively. The RF power used to igniting the second processing gas may be relatively low, such as between about 0.28 W/cm$^2$ and about 0.42 W/cm$^2$. The RF power may be pulsed. A relatively low bias power may be applied to second plasma. The bias power may be 0.028 W/cm$^2$ or below. The ion energy of the ions formed in the second plasma with the relatively low RF and bias powers may be lower than that of the first plasma. The ion energy of the ions in the second plasma may be less than about 20 eV. The ions with relatively low ion energy react with the surface of the substrate having the reactive sites to form an evaporable layer. In other words, the oxide layer is converted to an evaporable layer during operation 306. The evaporable layer generally has the same thickness as the oxide layer, such about 10 Angstroms.

At operation 308, the evaporable layer is evaporated at an elevated temperature, such as between about 550 degrees Celsius and about 650 degrees Celsius, exposing the group III-V semiconductor material therebelow. A third processing gas may be provided to protect the group III-V semiconductor material, such as GaAs, from decomposing due to the elevated temperature during the evaporation operation. The third processing gas may include a hydrogen source gas, such as $H_2$, and a gas containing group III-V semiconductor material, such as arsine ($AsH_3$). A clean and atomic flat group III-V semiconductor material surface is formed as the result of evaporating the evaporable layer and exposing the group III-V semiconductor material disposed therebelow to the third processing gas.

At operation 310, an oxide layer is formed on the clean surface of the group III-V semiconductor material at a temperature range lower than the temperature utilized during the evaporation operation. The substrate may be first cooled to an oxidation temperature less than about 400 degrees Celsius. The oxidation temperature may be greater than the temperature at operations 304 and 306. An oxygen containing gas is flowed into the processing chamber to oxidize the exposed group III-V semiconductor material while the substrate is maintained within the oxidation temperature range. The oxygen containing gas may be any suitable oxygen containing gas, such as oxygen gas ($O_2$). In one embodiment, the oxygen containing gas is used to oxidize an exposed portion of the group III-V semiconductor material. In another embodiment, the oxygen containing gas is ignited by a low RF power to form a plasma, and the plasma is used to oxidize an exposed portion of the group III-V semiconductor material. The oxidization of the group III-V semiconductor material is a self-limiting reaction. In other words, once the group III-V semiconductor material is oxidized to a certain thickness, additional exposure of the group III-V semiconductor material to the oxygen containing gas or plasma will not appreciably increase the thickness of the formed oxide layer. In one embodiment, the oxidized layer formed from the group III-V semiconductor material has a thickness of about 10 Angstroms. Due to the self-limiting nature of the oxidizing operation, the thickness of the oxidized layer formed from the group III-V semiconductor material is controlled.

Following the formation of the oxide layer, operations 304, 306, and 308 may be repeated to convert the oxide layer to an evaporable layer, and evaporate the evaporable layer. Because the oxide layer is formed with a controlled thickness, such about 10 Angstroms, the evaporable layer also has a controlled thickness, which is the same as the oxide layer. Thus, the depth of a recessed depth formed in the group III-V semiconductor material can be precisely controlled by the iterative process described above. For example, if the depth of the recessed depth in the group III-V semiconductor material should be 50 Angstroms, operations 304, 306, 308 and 310 are performed five times, without performing the last operation 310, if each evaporable layer is 10 Angstroms thick.

Figure 4A:
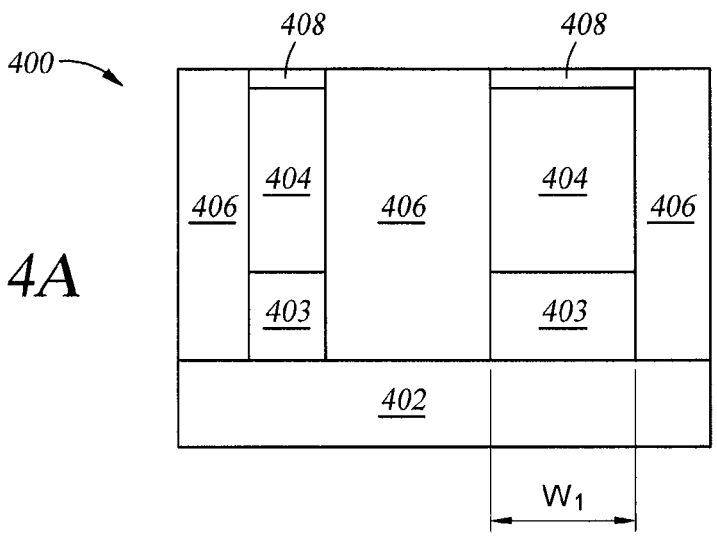
FIGS. 4A-4F illustrate a partial, cross-sectional view of a transistor at various stages of fabrication according to embodiments disclosed herein.

FIGS. 4A-4F illustrate a partial, cross-sectional view of a transistor 400 at various stages of fabrication according to embodiments disclosed herein. The transistor 400 may be a FinFET or a TFET. As shown in FIG. 4A, the transistor 400 includes a substrate 402 including one or more protrusions 403. The substrate 402 may be a silicon-containing substrate. The substrate may further include germanium (Ge), carbon (C), boron (B), phosphorous (P), or other known elements that may be co-grown, doped and/or associated with silicon materials. The one or more protrusions 403 may be made of the same material as the substrate 402 and may define a width $W_1$. The width $W_1$ may be the critical dimension of the transistor 400. In one embodiment, the width $W_1$ may be less than 7 nm, such as 5 nm or 3 nm. A channel base material 404 may be disposed on each protrusion 403. The channel base material 404 may be a group III-V semiconductor material, such as GaAs. An oxide layer 408 may be disposed on each channel base material 404. The oxide layer 408 may be a native oxide layer, or may be deposited by operation 310 of the method 300 described above. The oxide layer 408 may be $Ga_2O_3$, $As_2O_3$, $As_2O_5$ or any oxide of one or more group III-V semiconductor material. The oxide layer 408 may have a thickness of about 10 Angstroms. A dielectric material 406 are disposed between adjacent channel base materials 404. The dielectric material 406 may be a shallow trench isolation (STI) region of the transistor 400 and may be made of any suitable dielectric material, such $SiO_2$.

Figure 4B:
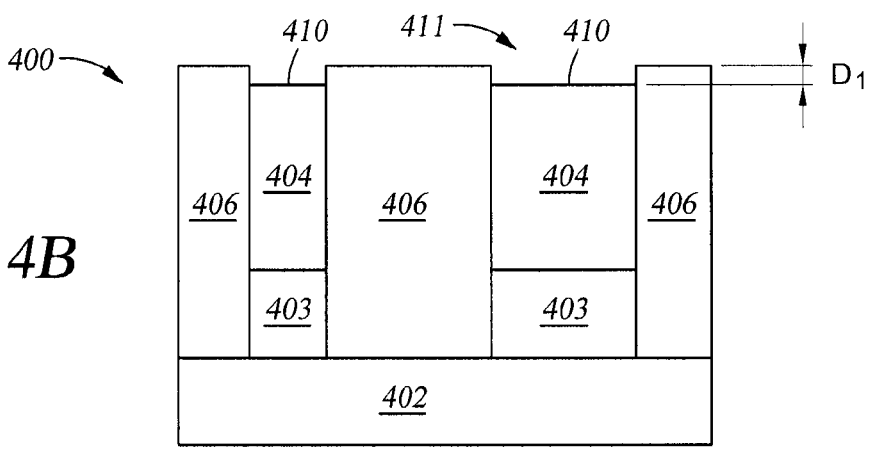
Figure 4C:
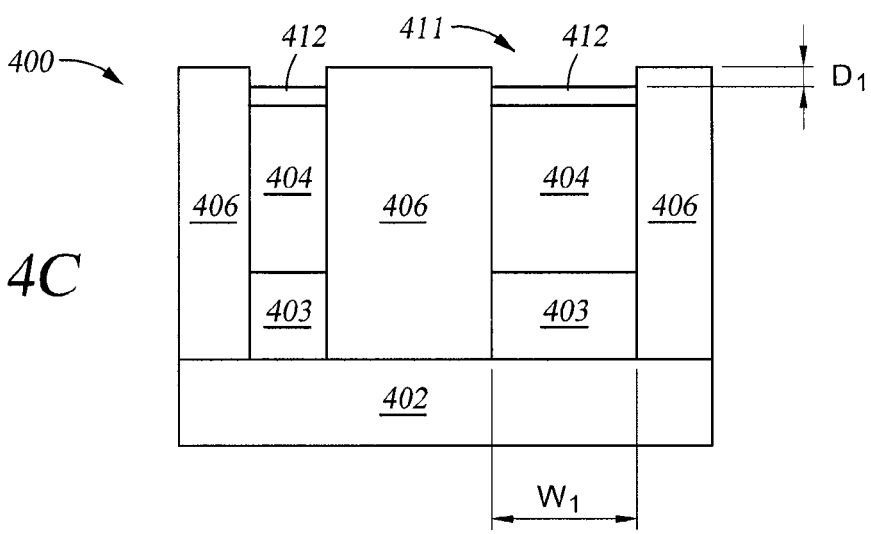

Next, the oxide layer 408 is removed, as shown in FIG. 4B. The removal of the oxide layer 408 may be by operations 304 and 306 shown in FIG. 3. A clean surface 410 of the channel base material 404 is exposed after the oxide layer 408 is removed using operations 304 and 306. In one embodiment, a clean GaAs surface 410 is exposed. A recessed depth 411 is formed as the result of the removal of the oxide layer 408. The recessed depth 411 has a controlled depth $D_1$ because the thickness of the oxide layer 408 is controlled when formed using operation 310 of the method 300. In one embodiment, the depth $D_1$ is about 10 Angstroms. An oxide layer 412 is then formed in the channel base material 404 inside the recessed depth 411, as shown in FIG. 4C. The oxide layer 412 may be formed using operation 310 of the method 300. Since the oxidation operation is self-limiting, as described in FIG. 3, the oxide layer 412 has substantially the same thickness each time the oxide layer is formed.

Figure 4D:
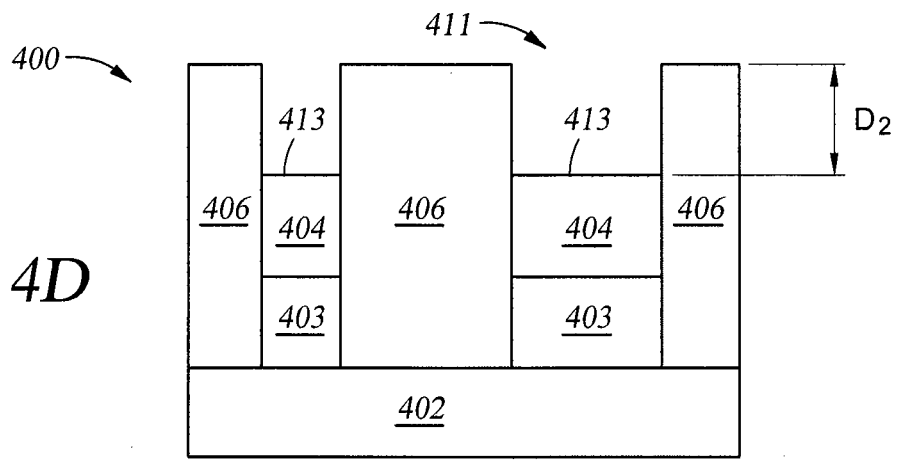
Figure 4E:
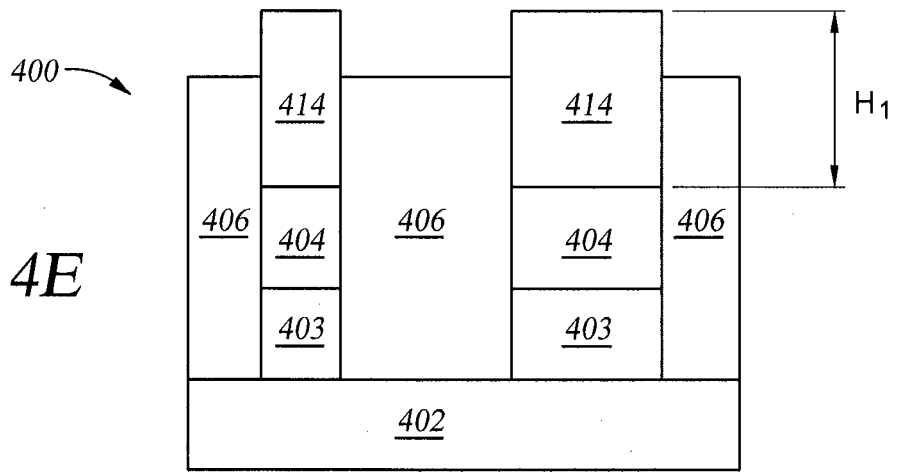

The operations performed to remove the oxide layer 408 and to form the oxide layer 412 may be repeated until the recessed depth 411 reaches a predetermined depth $D_2$, as shown in FIG. 4D. The depth $D_2$ equals to the depth $D_1$ multiplies by an integer, since each oxide layer removal operation removes a fixed depth $D_1$ (as a result of the oxide layer formed during each cycle has a fix thickness). Since the formation of the depth $D_1$ is highly controlled, the formation of the depth $D_2$ is also highly controlled. Once the predetermined depth is reached, the oxidation operation is omitted, leaving a clean surface 413 of the channel base material 404 exposed. Next, a channel material 414 is formed on the clean surface 413, as shown in FIG. 4E. The channel material 414 may be made of one or more group III-V semiconductor materials, such as indium-gallium-arsenide (InGaAs). The channel material 414 may be formed using an epitaxial deposition process and may be formed in an epitaxy chamber, such as the processing chamber 208. The channel material 414 may be deposited using a selective epitaxial deposition, so the channel material 414 is formed on the channel base material 404, but not on the dielectric material 406. The channel material 414 is deposited in the recessed depth 411 and may extend over the dielectric material 406. The channel material 414 may have a height $H_1$ which is greater than the depth $D_2$ at the end of the epitaxial deposition process.

Figure 4F:
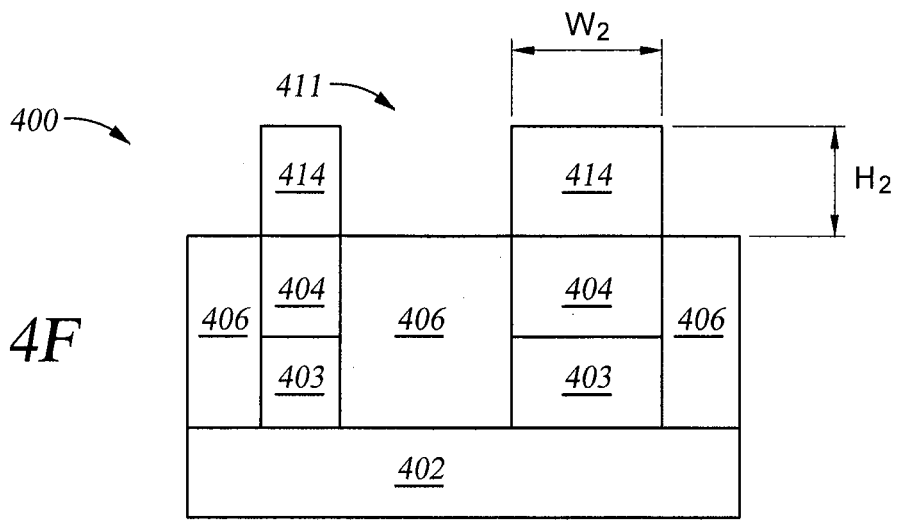

Following the deposition of the channel material 414, the portion of the channel material 414 extending over the dielectric material 406 may be removed by any suitable removal process, such as an etch back or chemical mechanical polishing (CMP), as shown in FIG. 4F. At the end of the removal process, the channel material 414 having a width $W_2$ and a height $H_2$ is formed. The height $H_2$ equals to the depth $D_2$. Thus, the height $H_2$ can be precisely controlled since the depth $D_2$ is precisely controlled. The width $W_2$ may be the critical dimension of the transistor 400 and the channel material 414 may have an aspect ratio of $W_2$ divided by $H_2$. The height $H_2$ may be determined by the specific aspect ratio that should be achieved. For example, the aspect ratio should be achieved is 10, then the height $H_2$ should be 50 nm if the critical dimension, or the width of the feature size, is 5 nm. The channel material 414 having a height $H_2$ of about 50 nm can be precisely formed by performing operations shown in FIGS. 4B and 4C five times, assuming the oxide layer 412 has a thickness of about 10 nm. Lastly, a portion of the dielectric material 406 surrounding the channel materials 414 may be removed by any suitable removal process, such as dry etching. The channel material 414 may be the channel region of a FinFET.

A method of forming a channel region in a transistor is disclosed. The method includes forming an oxide layer using a process that is self-limiting, leading to an oxide layer having a predictable thickness. By removing the predictable thickness of the oxide layer, corresponding thickness of the group III-V semiconductor material is consequently removed. The oxidation and removal processes are repeated to form a recessed depth equal to a multiple of the fixed thickness. Thus, the depth of the recessed depth is highly controlled. The depth of the recessed depth equals to a height of a channel region that is subsequently formed, and the height of the channel region is highly controlled as the result of the highly controlled depth of the recessed depth.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
 exposing an oxide layer formed on a substrate to a first plasma;
 exposing the oxide layer to a second plasma to convert the oxide layer to an evaporable layer at a first temperature;
 evaporating the evaporable layer at a second temperature higher than the first temperature to expose a surface of a group III-V semiconductor material; and
 exposing the surface of the group III-V semiconductor material to an oxygen containing gas.

2. The method of claim 1, wherein the first plasma is formed by igniting a first processing gas with a first radio-frequency power.

3. The method of claim 2, wherein the first processing gas comprises a noble gas and a hydrogen source gas.

4. The method of claim 2, wherein the first radio-frequency power ranges between about 0.28 W/cm$^2$ and about 0.42 W/cm$^2$.

5. The method of claim 1, wherein the second plasma is formed by igniting a second processing gas with a second radio-frequency power.

6. The method of claim 5, wherein the second processing gas comprises a noble gas, a halogen gas, and a hydrogen source gas.

7. The method of claim 1, wherein the first temperature is from about 20 degrees Celsius to less than about 400 degrees Celsius.

8. The method of claim 7, wherein the second temperature is between about 550 degrees Celsius and about 650 degrees Celsius.

9. The method of claim 1, further comprising exposing the surface of the group III-V semiconductor material to a third processing gas during the evaporating the evaporable layer.

10. The method of claim 9, wherein the third processing gas comprises arsine.

11. A method, comprising:
 breaking oxygen bonds in an oxide layer;
 converting the oxide layer to an evaporable layer at a first temperature;
 evaporating the evaporable layer at a second temperature higher than the first temperature to expose a surface of a group III-V semiconductor material; and
 oxidizing the surface of the group III-V semiconductor material.

12. The method of claim 11, wherein the breaking oxygen bonds is performed by exposing the oxide layer to a first plasma.

13. The method of claim 12, wherein the converting the oxide layer to the evaporable layer is performed by exposing the oxide layer to a second plasma.

14. The method of claim 11, further comprising exposing the surface of the group III-V semiconductor material to a processing gas during the evaporating the evaporable layer.

15. The method of claim 11, wherein the oxidizing the surface of the group III-V semiconductor material is performed by exposing the surface of the group III-V semiconductor material to an oxygen containing gas.

16. The method of claim 11, wherein the oxidizing the surface of the group III-V semiconductor material is performed by exposing the surface of the group III-V semiconductor material to an oxygen containing plasma.

17. A method, comprising:
 a) exposing an oxide layer to a first plasma;
 b) exposing the oxide layer to a second plasma to convert the oxide layer to an evaporable layer at a first temperature;
 c) evaporating the evaporable layer at a second temperature higher than the first temperature to expose a surface of a group III-V semiconductor material;
 d) exposing the surface of the group III-V semiconductor material to an oxygen containing gas;
 e) iteratively repeating at least a-c; and
 f) forming a channel material on the substrate.

18. The method of claim 17, wherein a-d are performed in a plasma processing chamber.

19. The method of claim 17, wherein the channel material is formed in an epitaxial deposition chamber.

20. The method of claim 18, wherein the group III-V semiconductor material comprises GaAs.

* * * * *